(12) United States Patent
Jung et al.

(10) Patent No.: US 12,520,501 B2
(45) Date of Patent: Jan. 6, 2026

(54) CHALCOGENIDE MATERIAL AND SEMICONDUCTOR DEVICE INCLUDING THE SAME

(71) Applicant: SK hynix Inc., Icheon (KR)

(72) Inventors: Gwang Sun Jung, Icheon (KR); Jun Ku Ahn, Icheon (KR); Sung Lae Cho, Icheon (KR); Uk Hwang, Icheon (KR)

(73) Assignee: SK hynix Inc., Icheon (KR)

( * ) Notice: Subject to any disclaimer, the term of this patent is extended or adjusted under 35 U.S.C. 154(b) by 404 days.

(21) Appl. No.: 18/299,608

(22) Filed: Apr. 12, 2023

(65) Prior Publication Data

US 2024/0179921 A1    May 30, 2024

(30) Foreign Application Priority Data

Nov. 30, 2022 (KR) .......... 10-2022-0163642

(51) Int. Cl.
*H10B 63/00* (2023.01)
*C04B 35/547* (2006.01)
*H10B 63/10* (2023.01)

(52) U.S. Cl.
CPC ........... *H10B 63/24* (2023.02); *C04B 35/547* (2013.01); *H10B 63/10* (2023.02); *C04B 2235/446* (2013.01)

(58) Field of Classification Search
CPC ...... H10B 63/24; H10B 63/10; C04B 35/547; C04B 2235/446; C03C 3/321; H10N 70/20; H10N 70/231; H10N 70/826; H10N 70/8828; H10N 70/8825
See application file for complete search history.

(56) References Cited

U.S. PATENT DOCUMENTS

| | | | |
|---|---|---|---|
| 11,856,872 B2* | 12/2023 | Jung | H10B 63/84 |
| 12,268,104 B2* | 4/2025 | Kim | H10N 70/826 |
| 2022/0052113 A1* | 2/2022 | Lee | H10N 70/8825 |
| 2022/0246847 A1* | 8/2022 | Nugent | H10N 70/011 |
| 2024/0324479 A1* | 9/2024 | Ikarashi | H10N 70/841 |

FOREIGN PATENT DOCUMENTS

| | | |
|---|---|---|
| KR | 1020170089633 A | 8/2017 |
| KR | 1020210082541 A | 7/2021 |

* cited by examiner

*Primary Examiner* — Allison Bernstein

(57) ABSTRACT

Disclosed is a chalcogenide material including germanium (Ge), selenium (Se), arsenic (As), silicon (Si) and indium (In). In the chalcogenide material, a content of selenium (Se) is 49 at % to 56 at %, a content of indium (In) is 1.1 at % or less, and a sum of contents of germanium (Ge) and silicon (Si) is 18 at % to 21 at %.

19 Claims, 15 Drawing Sheets

CHALCOGENIDE MATERIAL AND SEMICONDUCTOR DEVICE INCLUDING THE SAME

CROSS-REFERENCE TO RELATED APPLICATION(S)

This application claims priority under 35 U.S.C. § 119 to Korean Patent Application No. 10-2022-0163642, filed on Nov. 30, 2022, the disclosure of which is incorporated herein by reference in its entirety.

BACKGROUND

1. Technical Field

Various embodiments of the present disclosure relate to a material and an electronic device, and more particularly, to a chalcogenide material and a semiconductor device including the same.

2. Related Art

With the recent trend of electronic appliances toward miniaturization, low power consumption, high performance, and diversification, semiconductor devices capable of storing information in various electronic appliances such as a computer and a portable communication device have been demanded. Accordingly, research has been conducted for semiconductor devices capable of storing data by using characteristics of switching between different resistance states depending on an applied voltage or current. Examples of such semiconductor devices include a resistive random access memory (RRAM), a phase-change random access memory (PRAM), a ferroelectric random access memory (FRAM), a magnetic random access memory (MRAM), an e-fuse, and so on.

SUMMARY

In accordance with an embodiment, a chalcogenide material may include germanium (Ge), selenium (Se), arsenic (As), silicon (Si) and indium (In), wherein, in the chalcogenide material, a content of selenium (Se) is 49 at % to 56 at %, a content of indium (In) is 1.1 at % or less, and a sum of contents of germanium (Ge) and silicon (Si) is 18 at % to 21 at %.

In accordance with an embodiment, a semiconductor device may include a first electrode; a second electrode; and a first variable resistance layer positioned between the first electrode and the second electrode, and including a chalcogenide material, wherein the chalcogenide material includes germanium (Ge), selenium (Se), arsenic (As), silicon (Si) and indium (In), and has a mean coordination number is 2.60 to 2.68.

DETAILED DESCRIPTION

Various embodiments of the present disclosure are directed to a chalcogenide material and a semiconductor device including the same, capable of improving operational characteristics and reliability of the semiconductor device.

According to embodiments of the present disclosure, it is possible to reduce a leakage current and driving power of a semiconductor device. It is possible to improve a threshold voltage distribution of memory cells and secure a read margin. It is possible to improve the reliability of the semiconductor device.

Hereinafter, various embodiments according to the technical spirit of the present disclosure are described below with reference to the accompanying drawings.

Figure 1A:
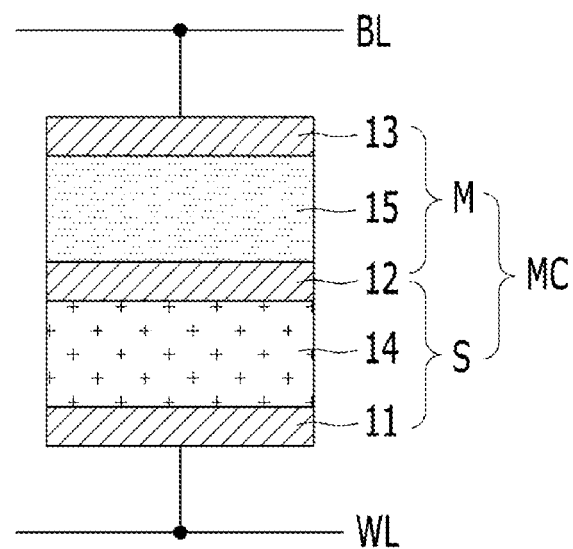
FIGS. 1A and 1B illustrate structures of a semiconductor device in accordance with embodiments.
Figure 1B:
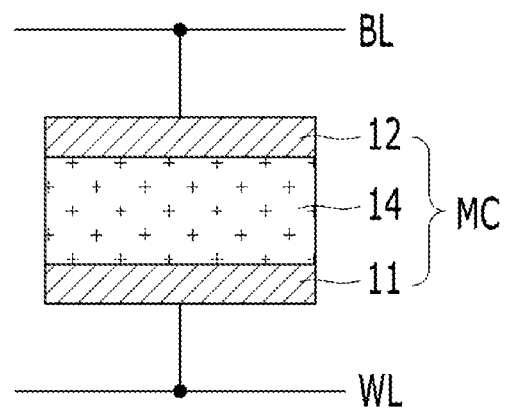

FIGS. 1A and 1B illustrate structures of a semiconductor device in accordance with embodiments.

Referring to FIG. 1A, the semiconductor device may include a memory cell MC, and further include a word line WL, and a bit line BL. The memory cell MC may be connected between the word line WL and the bit line BL. The memory cell MC may include a selection element S and a memory element M.

The selection element S may adjust a current flow therein depending on the magnitude of a voltage or current applied thereto. The memory cell MC may be selected according to turning-on or turning-off of the selection element S. The selection element S may include a first electrode 11, a first variable resistance layer 14, and a second electrode 12. The first variable resistance layer 14 may be positioned between the first electrode 11 and the second electrode 12. The first electrode 11 of the selection element S may be electrically connected to the word line WL. In another embodiment, the positions of the selection element S and the memory element M may be switched, and thus the first electrode 11 may be electrically connected to the bit line BL.

The first variable resistance layer 14 may be a switching layer, and may maintain a specific phase such as an amorphous state during an operation of the memory cell MC. The first variable resistance layer 14 may include a 5 element-based chalcogenide material. Types of elements included in the chalcogenide material and a content of each element in the chalcogenide material may be determined in consideration of characteristics of the first variable resistance layer 14 that is used as the switching layer. For example, the types of elements included in the chalcogenide material and the content of each element may be determined by complexly considering a leakage current, an energy band gap, a mean coordination number, thermal deformation, drift, and bouncing.

The chalcogenide material may include germanium (Ge), selenium (Se), arsenic (As), silicon (Si), and indium (In). In the chalcogenide material, a content (or atomic percentage) of selenium (Se) may be in a range of 49 at % to 56 at %; a content of indium (In) may be in a range of 1.1 at % or less. The sum of contents of germanium (Ge) and silicon (Si) may be in a range of 18 at % to 21 at %. The mean coordination number (MCN) of the chalcogenide material may be in a range of 2.60 to 2.68.

The memory element M may include the second electrode 12, a second variable resistance layer 15, and a third electrode 13. The second variable resistance layer 15 may be positioned between the second electrode 12 and the third electrode 13. The selection element S and the memory element M may share the second electrode 12. The third electrode 13 of the memory element M may be electrically connected to the bit line BL or the word line WL according to the relative positions of the memory element M and the selection element S.

The second variable resistance layer 15 may be a memory layer. The second variable resistance layer 15 may have characteristics of making a reversible transition between different resistance states depending on a voltage or current applied to the memory element M. For example, data "1" may be stored in the memory cell MC when the second variable resistance layer 15 has a low resistance state, and data "0" may be stored in the memory cell MC when the second variable resistance layer 15 has a high resistance state.

In an embodiment, the second variable resistance layer 15 may include a resistive material. As an electrical path is generated or destroyed in the second variable resistance layer 15, data "1" or "0" may be stored in the memory cell MC. For example, the second variable resistance layer 15 may include a transition metal oxide, or a metal oxide such as a perovskite-based material.

In another embodiment, the second variable resistance layer 15 may have a magnetic tunnel junction (MTJ) structure including a magnetization pinned layer, a tunnel barrier layer, and a magnetization free layer. Depending on a change in a magnetization direction of the magnetization free layer with respect to a magnetization direction of the magnetization pinned layer, data "1" or "0" may be stored in the memory cell MC. For example, the magnetization pinned layer and the magnetization free layer may each include a magnetic material, and the tunnel barrier layer may include a metal oxide.

In yet another embodiment, the second variable resistance layer 15 may include a phase change material. Data may be stored in the memory cell MC by performing a set operation of changing a state of the second variable resistance layer 15 from a high resistance amorphous state to a low resistance crystalline state or a reset operation of changing the state of the second variable resistance layer 15 from the low resistance crystalline state to the high resistance amorphous state. The second variable resistance layer 15 may include a chalcogenide material. The second variable resistance layer 15 may include silicon (Si), germanium (Ge), antimony (Sb), tellurium (Te), bismuth (Bi), indium (In), tin (Sn), selenium (Se), or one of combinations thereof. For example, the second variable resistance layer 15 may include Ge—Sb—Te (GST), and further include an impurity such as carbon (C) and nitrogen (N).

Each of the first electrode 11, the second electrode 12, and the third electrode 13 may include a conductive material such as a metal or a metal nitride. In an embodiment, each of the first electrode 11, the second electrode 12, and the third electrode 13 may include tungsten (W), tungsten nitride (WN), tungsten silicide (WSi), titanium (Ti), titanium nitride (TiNx), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), silicon carbide (SiC), silicon carbon nitride (SiCN), copper (Cu), zinc (Zn), nickel (Ni), cobalt (Co), lead (Pb), platinum (Pt), or one of combinations thereof.

The memory cell MC may include one of the first variable resistance layer 14 and the second variable resistance layer 15, or both of them.

Referring to FIG. 1B, a memory cell MC may include a first variable resistance layer 14, and the first variable resistance layer 14 may be used as a switching layer and a memory layer at the same time. In this case, the first variable resistance layer 14 may maintain a specific phase such as an amorphous state during an operation of the memory cell MC, and data may be stored according to a threshold voltage Vth of the memory cell MC.

In the structures described above with reference to FIGS. 1A and 1B, operational characteristics of the memory cell MC may be adjusted according to the composition of the first variable resistance layer 14. By adjusting the content of each element of the first variable resistance layer 14 including the 5 element-based chalcogenide material, it is possible to reduce a leakage current of memory cells adjacent to a selected memory cell MC when driving the selected memory cell MC. In addition, it is possible to reduce driving power of the semiconductor device, and improve a threshold voltage distribution of the memory cells MC in the semiconductor device.

Figure 2A:
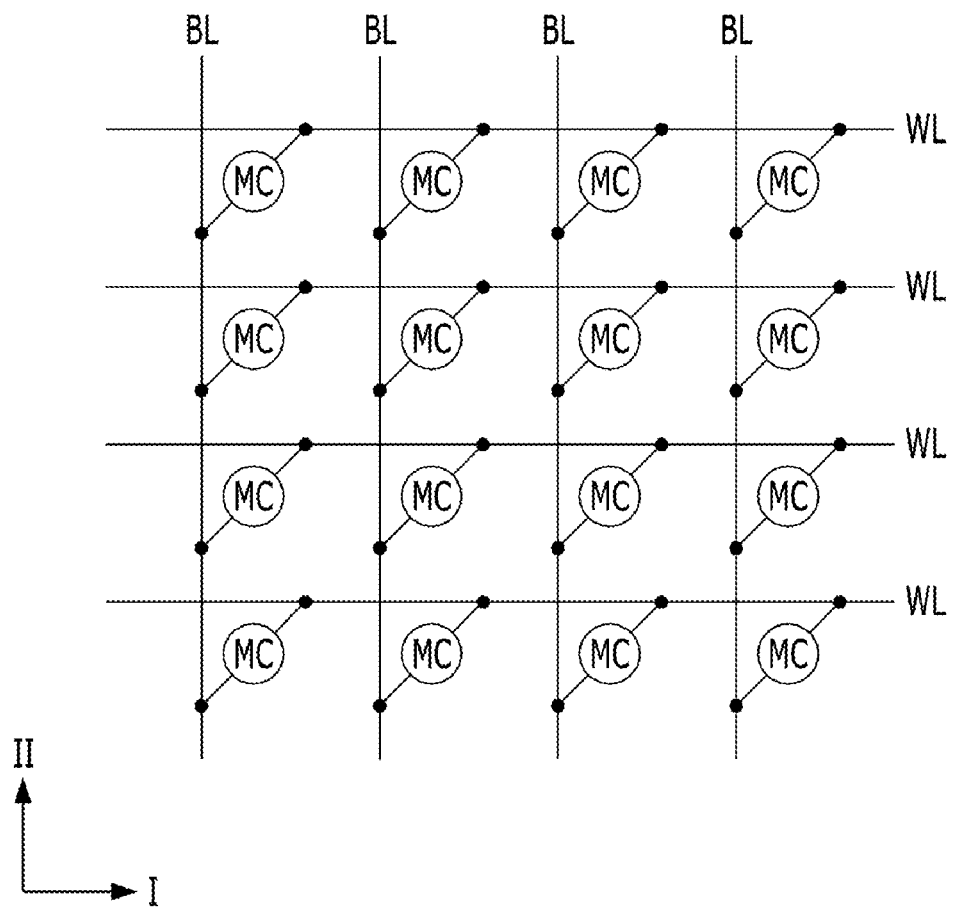
FIGS. 2A and 2B illustrate structures of a semiconductor device in accordance with embodiments.
Figure 2B:
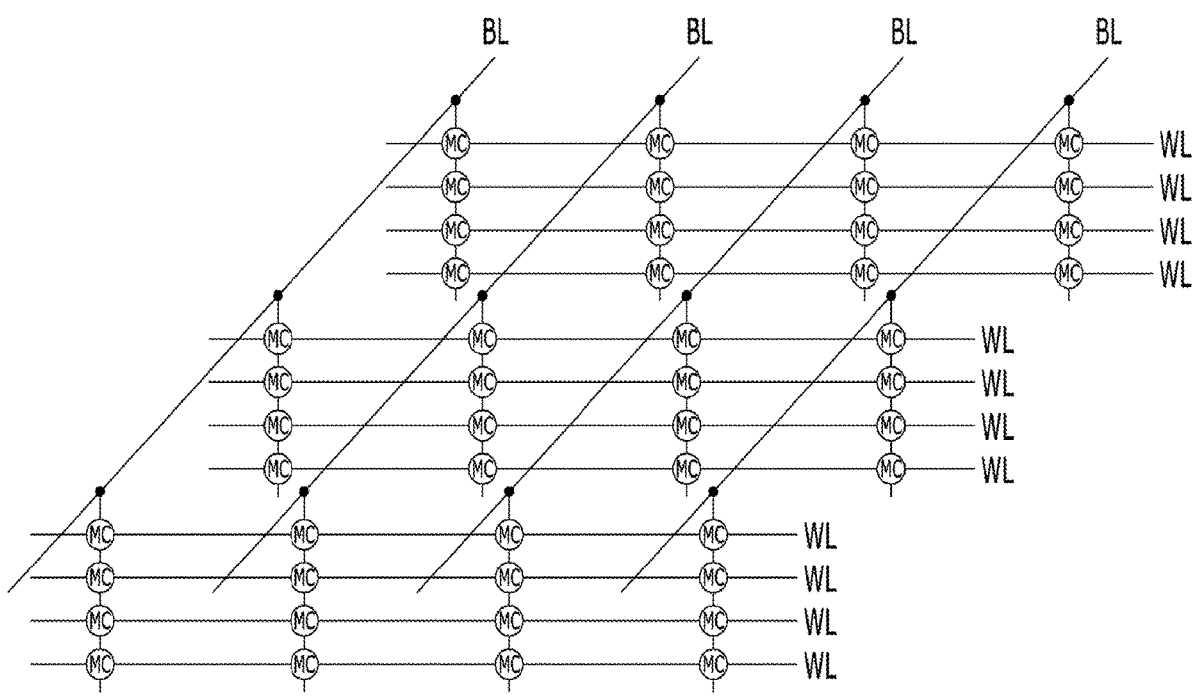
Figure 2B:
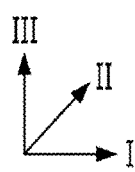

FIGS. 2A and 2B illustrate structures of a semiconductor device in accordance with embodiments. Hereinafter, detailed descriptions of configurations similar to those of the semiconductor device illustrated in FIGS. 1A and 1B are omitted.

Referring to FIG. 2A, the semiconductor device may include word lines WL, bit lines BL, and memory cells MC. The word lines WL may extend in a first direction I, and the bit lines BL may extend in a second direction II intersecting the first direction I. Each of the memory cells MC may be connected between one of the word lines WL and a corresponding one of the bit lines BL. The memory cells MC may be arranged in the first direction I and the second direction II. Each of the memory cells MC may have the structure described above with reference to FIG. 1A or FIG. 1B.

Referring to FIG. 2B, the semiconductor device may include word lines WL, bit lines BL, and memory cells MC. The word lines WL may extend in a first direction I, and be stacked in a third direction III. The bit lines BL may extend in a second direction II. The first to third directions I, II, and III may be perpendicular to each other. The memory cells MC may be disposed at intersections of the bit lines BL and the word lines WL. A plurality of memory cells MC may be disposed at intersections of each of bit lines BL and a plurality of word lines WL stacked in the third direction III. The plurality of memory cells MC may be electrically connected to the bit line BL through a vertical electrode. Each of the memory cells MC may have the structure described above with reference to FIG. 1A or FIG. 1B.

According to the structure described above, the memory cells MC may be arranged in a cross-point array structure and be stacked in the third direction III, which improves the degree of integration of the semiconductor device. In addition, as a word line WL is selected according to a row address and a bit line BL is selected according to a column address, so that a desired memory cell MC coupled between the selected word line WL and the selected bit line BL may be selected. A set operation or a reset operation may be performed on the selected memory cell MC to store data in the selected memory cell MC.

Since the memory cells MC are arranged in an array form, a leakage current may occur in memory cells MC adjacent to the selected memory cell MC. Accordingly, by adjusting the composition of the first variable resistance layer 14 or the second variable resistance layer 15 included in each of the memory cells MC, it is possible to reduce the leakage current and driving power of the semiconductor device. For example, the mean coordination number or the content of each element in the chalcogenide material may be adjusted in consideration of band gap energy of the first chalcogenide layer 14 used as the switching layer.

Figure 3:
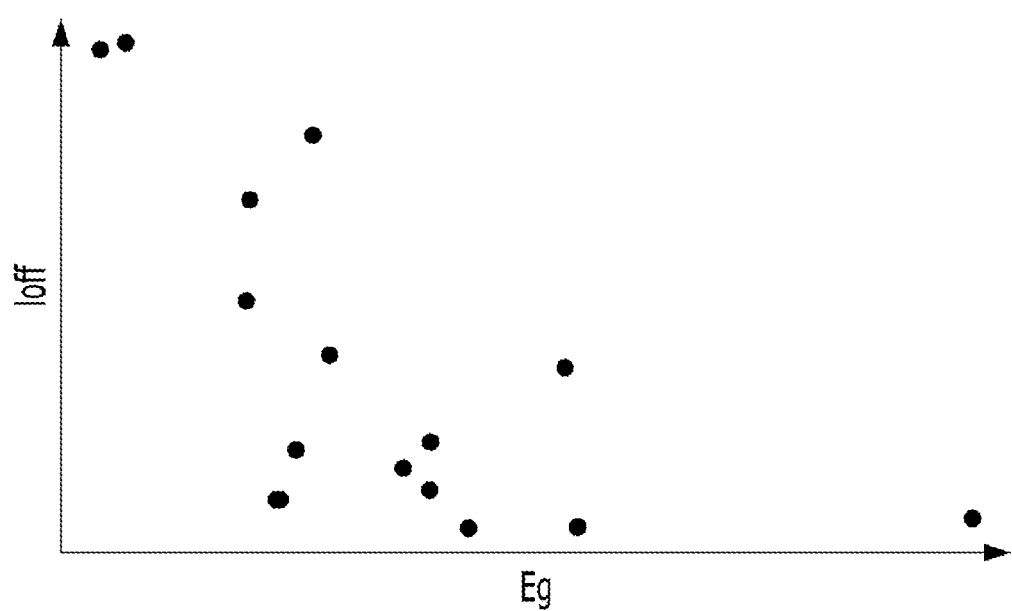
FIG. 3 is a graph illustrating characteristics of a chalcogenide material in accordance with an embodiment.

FIG. 3 is a graph illustrating characteristics of a chalcogenide material in accordance with an embodiment. In FIG. 3, the X axis represents an energy band gap Eg, and the Y axis represents a leakage current Ioff.

FIG. 3 shows a relationship between the energy band gap Eg and the leakage current Ioff. Referring to FIG. 3, the larger the energy band gap Eg, the smaller the leakage current Ioff. According to the Poole-Frenkel conduction mechanism, electrons may move using trap sites in an insulator. When thermal energy greater than an energy barrier is supplied to the insulator, the electrons may move between the trap sites. Thus, the movement of electrons may be reduced or minimized by increasing the energy barrier. Herein, the energy barrier may be a difference (Ec−Et) between a conduction energy level (Ec) and a trap energy level (Et). Since numerous trap sites are present in the chalcogenide material, the difference (Ec−Et) between the conduction energy level and the trap energy level may be the same as or similar to a difference (Ec−Ef) between the conduction energy level and a Fermi energy level (Ef).

Therefore, by increasing the energy band gap of the chalcogenide material, it is possible to minimize Poole-Frenkel conduction while a selection element in a memory cell is turned off. Consequently, it is possible to reduce or minimize the leakage current Ioff of memory cells.

Figure 4A:
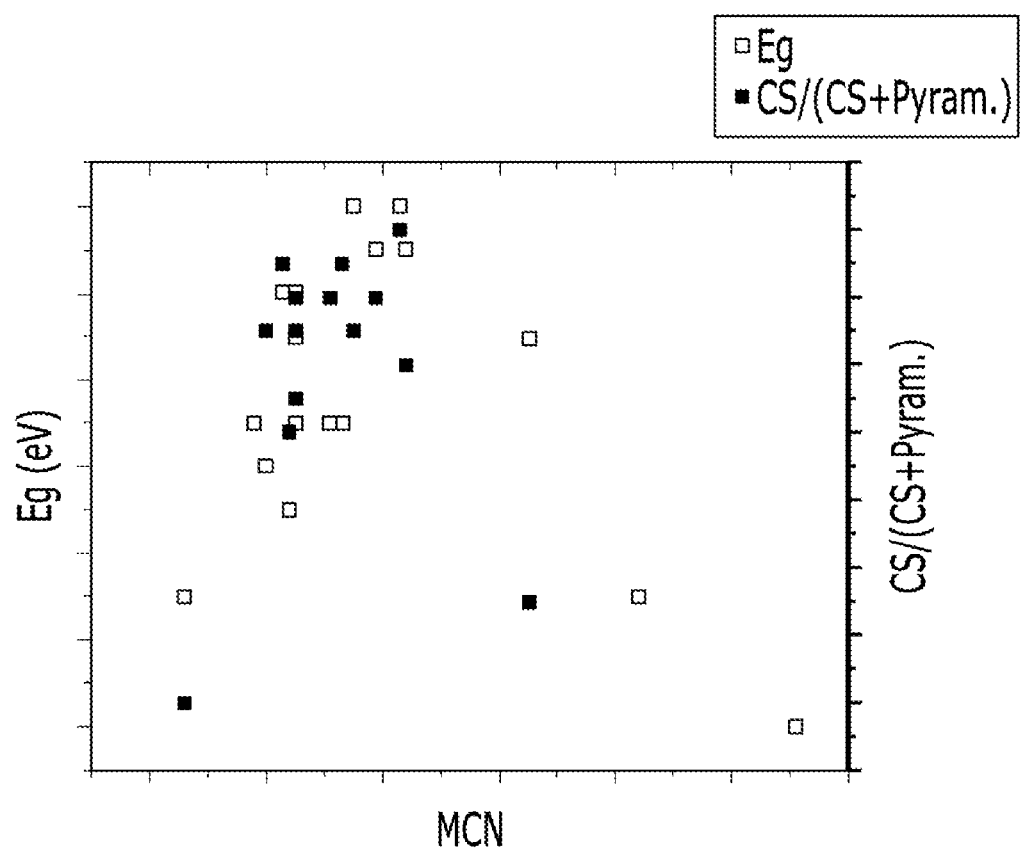
FIGS. 4A to 4C are graphs illustrating characteristics of a chalcogenide material in accordance with an embodiment.
Figure 4B:
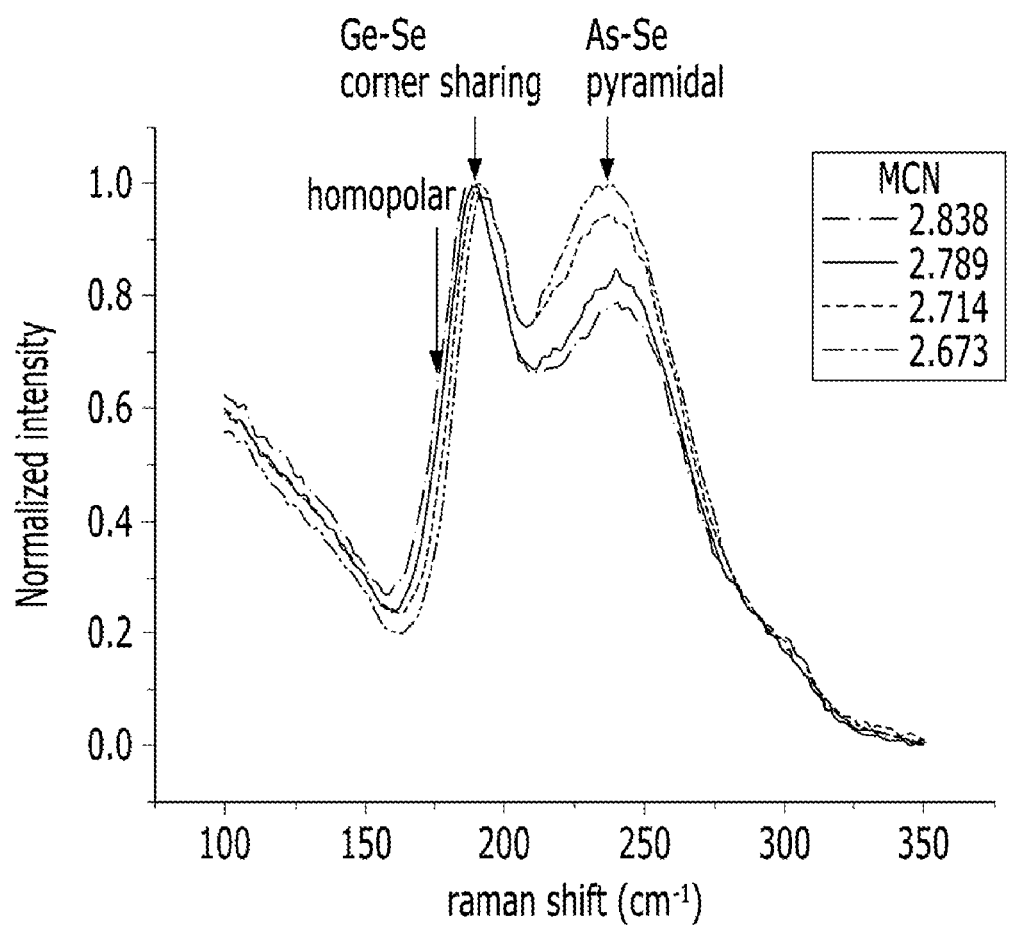
Figure 4C:
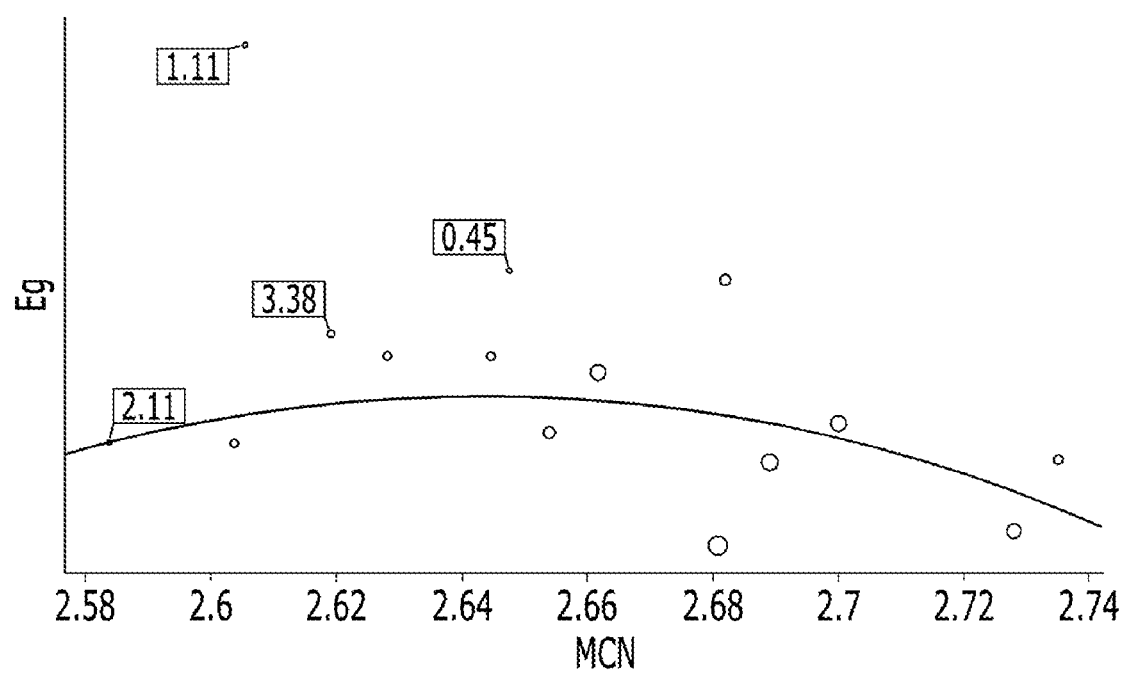

FIGS. 4A to 4C are graphs illustrating characteristics of a chalcogenide material in accordance with an embodiment.

FIG. 4A shows a relationship between a mean coordination number MCN of the chalcogenide material and an energy band gap Eg. In FIG. 4A, the X axis represents the mean coordination number MCN, and the Y axis represents the energy band gap Eg. Referring to FIG. 4A, the energy band gap Eg increases in a specific range of the mean coordination number MCN. For example, the energy band gap Eg increases to a maximum level in the specific range of the mean coordination number MCN, and decreases beyond the specific range of the mean coordination number MCN.

The mean coordination number MCN may be calculated using Equation 1 below. In Equation 1, "ri" represents a coordination number of a covalent bond, and "ai" represents a molar fraction or an atomic concentration.

$$MCN = \Sigma r_i * a_i \quad \text{[Equation 1]}$$

The 5 element-based chalcogenide material according to an embodiment of the present disclosure may include germanium (Ge), selenium (Se), arsenic (As), silicon (Si), and indium (In). A coordination number of each of germanium (Ge) and silicon (Si) corresponding to group 14 is 4, a coordination number of indium (In) corresponding to group 13 is 3, a coordination number of arsenic (As) corresponding to group 15 is 3, and a coordination number of selenium (Se) corresponding to group 16 is 2.

In an embodiment, in the chalcogenide material, the content of germanium (Ge) may be 14.7 at %, the content of arsenic (As) may be 26.4 at %, the content of selenium (Se) may be 56.5 at %, the content of indium (In) may be 2.1 at %, and the content of silicon (Si) may be 0.3 at %. The mean coordination number MCN may be calculated by applying the coordination number and the content of each element included in the chalcogenide material to Equation 1, and thus the mean coordination number MCN may be 2.585.

In another embodiment, in the chalcogenide material, the content of germanium (Ge) may be in a range of 13.0 at % to 17.0 at %, the content of arsenic (As) may be in a range of 20.5 at % to 35.6 at %, the content of selenium (Se) may be in a range of 49.6 at % to 53.6 at %, the content of indium (In) may be in a range of 0.4 at % to 8.0 at %, and the content of silicon (Si) may be in a range of 1.4 at % to 2.9 at %. The mean coordination number MCN may be calculated by applying the coordination number and the content of each element included in the chalcogenide material to Equation 1, and the mean coordination number MCN of the chalcogenide material may be in a range of 2.60 to 2.68.

In yet another embodiment, in the chalcogenide material, the content of germanium (Ge) may be in a range of 13.0 at % to 16.8 at %, the content of arsenic (As) may be in a range of 25.5 at % to 35.6 at %, the content of selenium (Se) may be in a range of 49.6 at % to 54.4 at %, the content of indium (In) may be in a range of 0.4 at % to 2.4 at %, and the content of silicon (Si) may be in a range of 0.9 at % to 3.0 at %. The mean coordination number MCN may be calculated by applying the coordination number and the content of each element included in the chalcogenide material to Equation 1, and the mean coordination number MCN of the chalcogenide material may be in a range of 2.64 to 2.68.

In the 5 element-based chalcogenide material, binary compounds Ge—Se and As—Se may be main bonds. In a crystalline structure of the 5 element-based chalcogenide material, Ge—Se may be bonded in a corner sharing (CS) method, and As—Se may be bonded in a pyramid method. With respect to changes in the mean coordination number MCN, a ratio of corner sharing CS/(CS+Pyram.) and the behavior of the energy band gap Eg have a correlation therebetween.

FIG. 4B shows a result of analyzing a difference in bonding methods according to the mean coordination number MCN of the chalcogenide material by using a Raman spectrum. In FIG. 4B, the X axis represents a Raman shift, and the Y axis represents a normalized intensity of scattered light.

When the content of germanium (Ge), silicon (Si), or arsenic (As) included in the 5 element-based chalcogenide material increases, the mean coordination number MCN increases. In this case, when the content of germanium (Ge), silicon (Si), or arsenic (As) is higher than a reference value, selenium (Se) to be bonded to germanium (Ge), silicon (Si), or arsenic (As) is deficient, and therefore, a homopolar bond such as Ge—Ge, As—As, or Si—Si increases. The homopolar bond may form a shallow trap level at a near band edge (NBE), and thus cause a reduction in the difference (Ec−Ef) between the conduction energy level (Ec) and the Fermi energy level (Ef). In this case, a leakage current may occur.

Referring to FIG. 4B, a chalcogenide material whose mean coordination number MCN is 2.673 has large numbers of As—Se pyramidal bonds and Ge—Se corner sharing bonds and a small number of homopolar bonds. On the other hand, chalcogenide materials whose mean coordination numbers MCNs are 2.714, 2.789, and 2.838 have smaller numbers of As—Se pyramidal bonds and Ge—Se corner sharing bonds and a larger number of homopolar bonds, compared to the chalcogenide material whose mean coordination number MCN is 2.673. Therefore, by implementing a memory cell MC using the chalcogenide material whose mean coordination number MCN is 2.673 as a switching layer, it is possible to decrease a leakage current of a selection element of the memory cell MC. On the other hand, when any of the chalcogenide materials whose mean coordination numbers MCNs are 2.714, 2.789, and 2.838 is used as the switching layer, a leakage current may be induced in the selection element.

FIG. 4C shows a relationship between the mean coordination number MCN of the chalcogenide material and the energy band gap Eg. In FIG. 4C, the X axis represents the mean coordination number MCN, and the Y axis represents the energy band gap Eg.

Referring to FIG. 4C, the energy band gap Eg has a maximum value when the mean coordination number MCN is approximately 2.64, and the energy band gap Eg decreases when the mean coordination number MCN is larger or smaller than 2.64. Therefore, a range of the mean coordination number MCN may be determined on the basis of the mean coordination number MCN of 2.64 at which the energy band gap Eg has the maximum value. For example, in consideration of a change in the energy band gap Eg according to the mean coordination number MCN, a chalcogenide material whose mean coordination number MCN is 2.64 to 2.68 may be used as a switching layer.

In addition, when the range of the mean coordination number MCN is determined, characteristics of indium (In) may be considered. Indium (In) may enable the chalcogenide material to stably maintain an amorphous state, and allow the selection element to have a uniform threshold voltage. However, since the energy band gap Eg of indium (In) is low, the content of indium (In) may be adjusted in consideration of the energy band gap Eg of the chalcogenide material.

Ge—Se, which is the main compound in the 5 element-based chalcogenide material, may have an energy band gap Eg of approximately 2.18 eV or less, and As—Se may have an energy band gap Eg of approximately 1.77 eV or less. In—Se may be a bond having the lowest energy band gap Eg among the compounds in the chalcogenide material, and may have an energy band gap Eg of approximately 1.4 eV to approximately 1.6 eV. Therefore, when the content of indium (In) is increased, the energy band gap Eg of the chalcogenide material may decrease, and a leakage current Ioff may increase. On the other hand, when the content of indium (In) is decreased, the energy band gap Eg of the chalcogenide material may increase, and the leakage current Ioff may decrease.

When the content of indium (In) is 3.38 at % or less, the energy band gap Eg may increase, and the leakage current Ioff may decrease. For example, by using a chalcogenide material having the content of indium (In) of 3.38 at % or less and the mean coordination number MCN of 2.64 to 2.68 as a switching layer, it is possible to decrease the leakage current of the semiconductor device. In addition, when the content of indium (In) is 1.1 at % or less or 0.45 at % to 1.1 at %, the energy band gap Eg increases due to a decrease in the content of indium (In), and therefore, the leakage current of the semiconductor device may decrease even when the mean coordination number MCN is smaller than 2.64. Accordingly, when the content of indium (In) is 1.1 at % or less or 0.45 at % to 1.1 at %, a chalcogenide material whose mean coordination number MCN is 2.60 to 2.68 may be used as the switching layer.

Figure 5A:
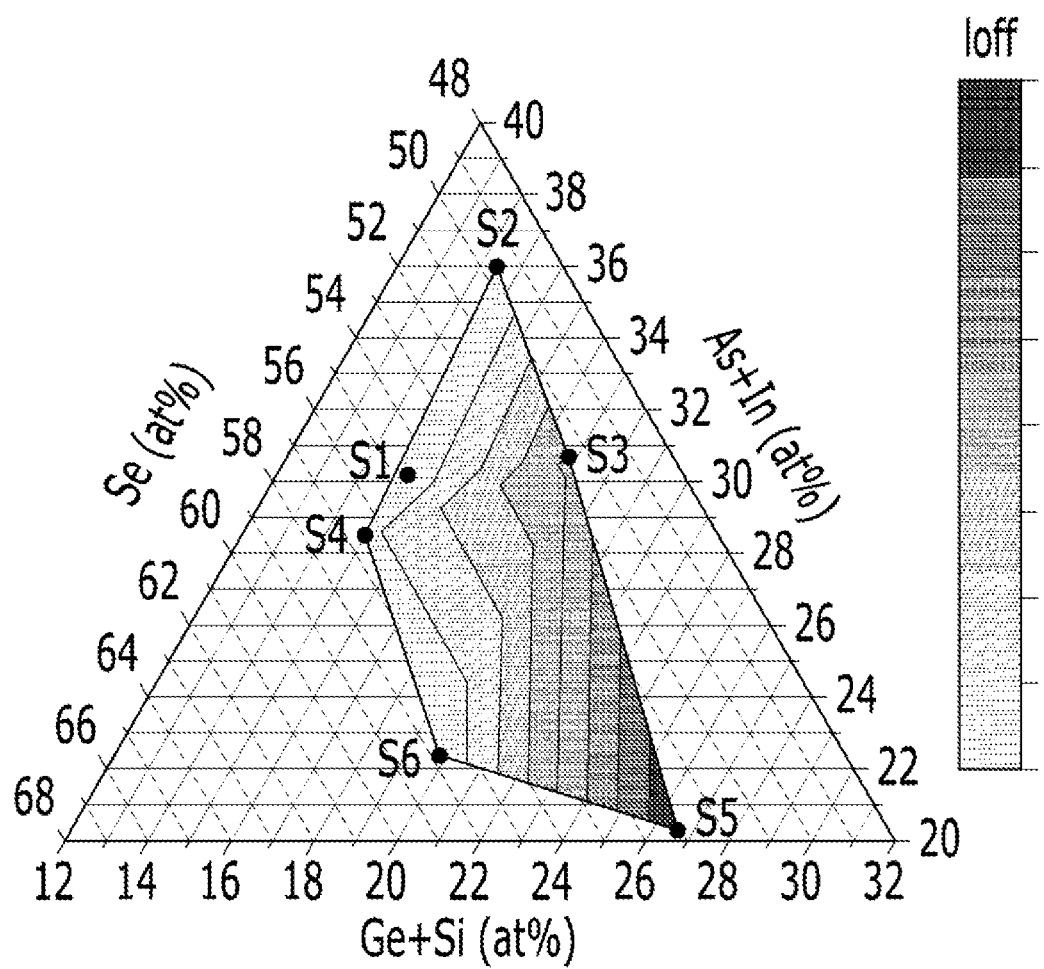
FIGS. 5A to 5C are graphs illustrating characteristics of a chalcogenide material in accordance with an embodiment.
Figure 5B:
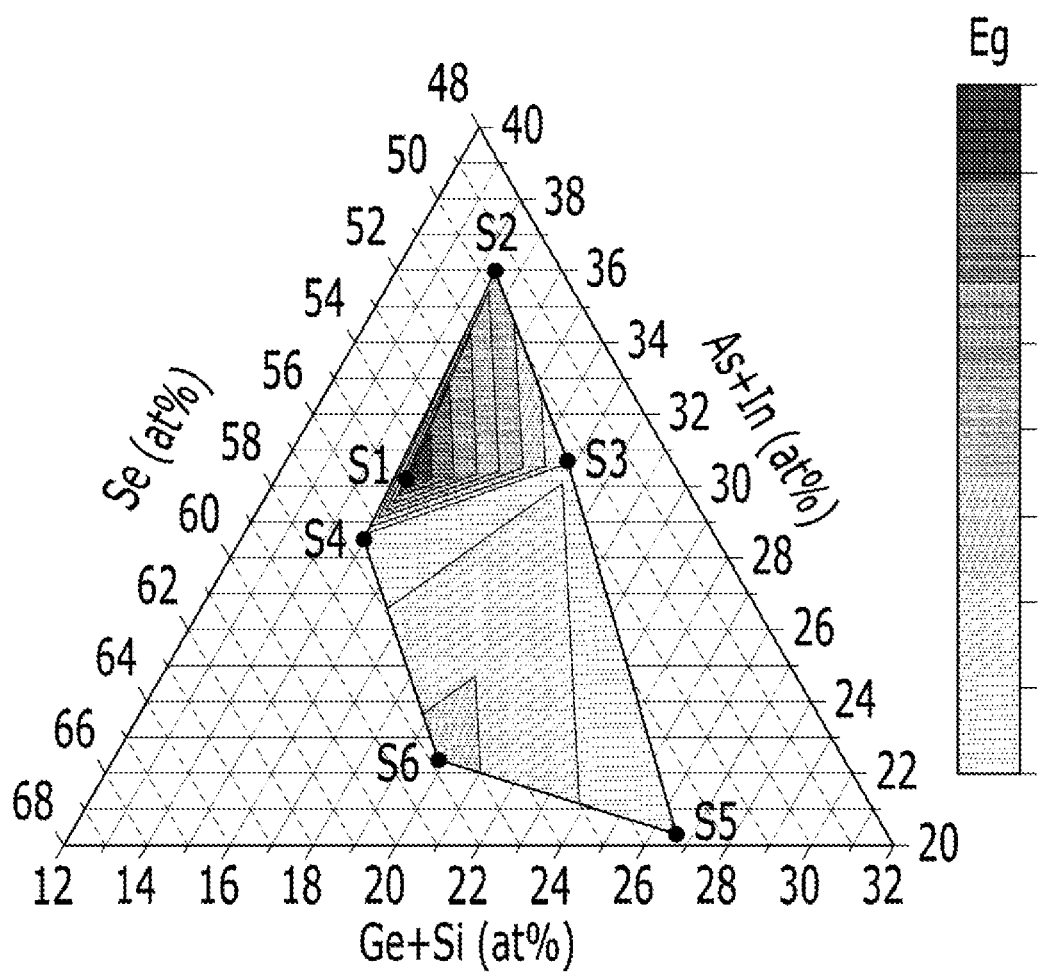
Figure 5C:
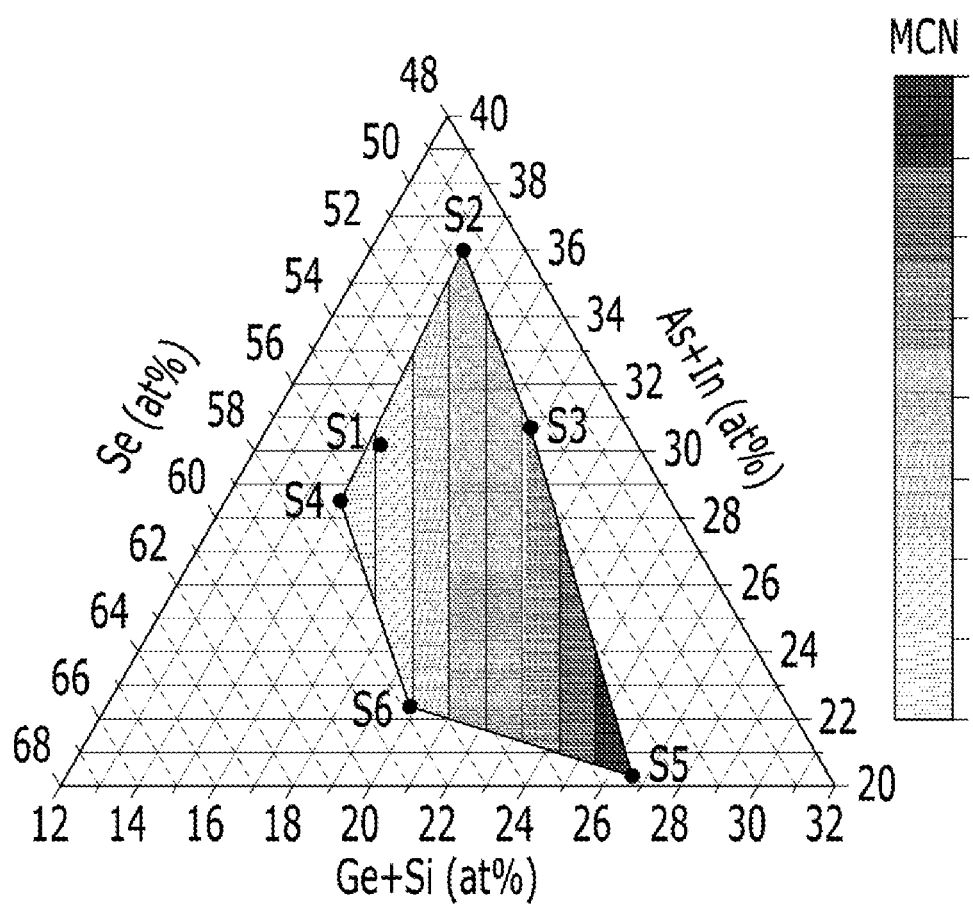

FIGS. 5A to 5C are graphs illustrating characteristics of a chalcogenide material in accordance with an embodiment. Each of FIGS. 5A to 5C shows a change in the characteristics of the chalcogenide material depending on the content of selenium (Se), the contents of arsenic (As) and indium (In), and the contents of germanium (Ge) and silicon (Si).

FIG. 5A shows a change in a leakage current Ioff depending on the composition of the chalcogenide material. In FIG. 5A, the darker the shade, the larger the leakage current Ioff, and the fainter the shade, the smaller the leakage current Ioff.

FIG. 5B shows a change in an energy band gap Eg depending on the composition of the chalcogenide material. The darker the shade, the larger the energy band gap Eg, and the fainter the shade, the smaller the energy band gap Eg.

FIG. 5C shows a change in a mean coordination number MCN depending on the composition of the chalcogenide material. The darker the shade, the larger the mean coordination number MCN, and the fainter the shade, the smaller the mean coordination number MCN. Table 1 below shows a plurality of samples (S1 to S6) of the composition of the chalcogenide material.

TABLE 1

|  | Ge | As | Se | In | Si |
| --- | --- | --- | --- | --- | --- |
| Sample 1(S1) | 12.9 at % | 29.1 at % | 54.6 at % | 1.1 at % | 2.3 at % |
| Sample 2(S2) | 13.0 at % | 35.6 at % | 49.6 at % | 0.4 at % | 1.4 at % |
| Sample 3(S3) | 16.8 at % | 29.2 at % | 50.5 at % | 1.4 at % | 2.1 at % |
| Sample 4(S4) | 14.7 at % | 26.4 at % | 56.5 at % | 2.1 at % | 0.3 at % |
| Sample 5(S5) | 23.4 at % | 16.6 at % | 53.1 at % | 3.7 at % | 3.2 at % |
| Sample 6(S6) | 18.6 at % | 19.0 at % | 57.8 at % | 3.4 at % | 1.2 at % |

Referring to FIG. 5A, comparing sample 5 (S5) and sample 6 (S6), the leakage current Ioff of sample 6 (S6) in which the sum of contents of germanium (Ge) and silicon (Si) is 19.8 at % is smaller than that of sample 5 (S5) in which the sum of contents of germanium (Ge) and silicon (Si) is 26.6 at %. Comparing sample 3 (S3) and sample 6 (S6), the leakage current Ioff of sample 6 (S6) having selenium (Se) of 57.8 at % is smaller than that of sample 3 (S3) having selenium (Se) of 50.5 at %.

Comparing FIGS. 5A and 5B, when the energy band gap Eg of the chalcogenide material is large, the leakage current Ioff is small. In addition, comparing sample 2 (S2) and sample 3 (S3) in FIG. 5B, the energy band gap Eg of sample 2 (S2) having indium (In) of 0.4 at % is larger than that of sample 3 (S3) having indium (In) of 1.4 at %.

Comparing sample 1 (S1) and sample 4 (S4) in FIG. 5C, the mean coordination numbers MCN of both sample 1 (S1) and sample 4 (S4) are lower than 2.64. Comparing FIGS. 5B and 5C, the energy band gap Eg of sample 1 (S1) having indium (In) of 1.1 at % is larger than that of sample 4 (S4) having indium (In) of 2.1 at %.

Comparing FIGS. 5B and 5C, the energy band gap Eg has a maximum value at the mean coordination number MCN of 2.64. In addition, comparing sample 1 (S1) and sample 6 (S6), the energy band gap Eg of sample 1 (S1) having indium (In) of 1.1 at % is larger than that of sample 6 (S6) having indium (In) of 3.4 at %.

Accordingly, the composition of the chalcogenide material may be determined in consideration of the leakage current Ioff, the energy band gap Eg, and the mean coordination number MCN. For example, the chalcogenide material included in the switching layer may include germanium (Ge), selenium (Se), arsenic (As), silicon (Si), and indium (In). Herein, selenium (Se) may be included in a range of 49 at % to 56 at %, indium (In) may be included with 1.1 at % or less, and the sum of contents of germanium (Ge) and silicon (Si) may be in a range of 18 at % to 21 at %. In addition, the mean coordination number MCN of the chalcogenide material may be in a range of 2.60 to 2.68, or in a range of 2.64 to 2.68.

Figure 6:
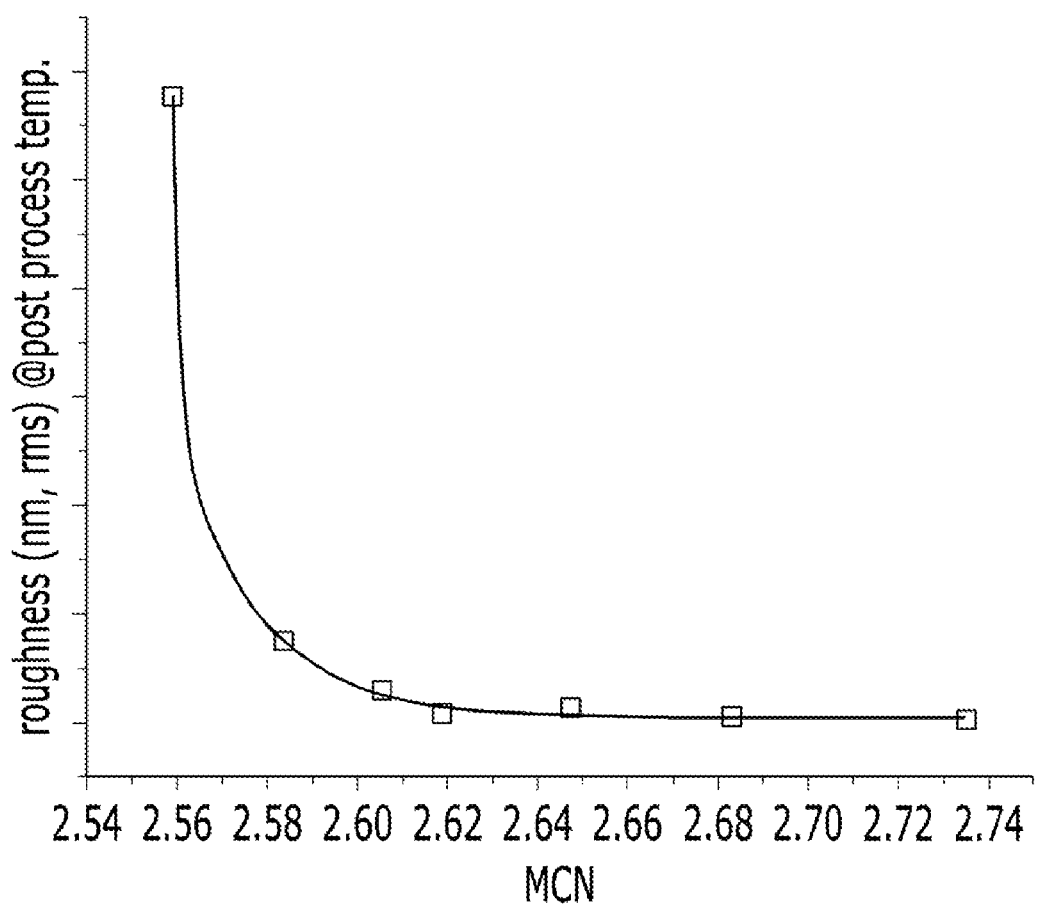
FIG. 6 is a graph illustrating characteristics of a chalcogenide material in accordance with an embodiment.

FIG. 6 is a graph illustrating characteristics of a chalcogenide material in accordance with an embodiment, and shows a relationship between a mean coordination number MCN and roughness of the chalcogenide material. In FIG. 6, the X axis represents the mean coordination number MCN, and the Y axis represents roughness (rms).

In order to use the chalcogenide material as a variable resistance layer of a memory cell, stability against a change in temperature is required. For example, the stability of the chalcogenide material according to a temperature of processes performed after the variable resistance layer is formed in a manufacturing process of a semiconductor device may be considered. To this end, it is possible to evaluate how much the roughness of the chalcogenide material deteriorates at a temperature that is equal to or higher than a glass transition temperature of the chalcogenide material.

Germanium (Ge) and silicon (Si) included in the chalcogenide material each have a coordination number of 4, arsenic (As) and indium (In) each have a coordination number of 3, and selenium (Se) has a coordination number of 2. As the coordination number participating in the covalent bond increases, bonding strength increases, and thus the roughness may deteriorate less. Since, when the mean coordination number MCN is small, the glass transition temperature may be low and thus the roughness may deteriorate, a pattern including the chalcogenide material may tilt or collapse during the manufacturing process of the semiconductor device.

Referring to FIG. 6, when the mean coordination number MCN is 2.60 or less, the roughness deteriorates to a significant difference level (p-value<0.05). Herein, a probability value (p-value) may be an indicator used when analyzing a statistically significant difference. Therefore, considering the transformation of the chalcogenide material at a temperature of approximately 300° C. in a subsequent process, the composition of the chalcogenide material may be determined such that the mean coordination number MCN is 2.60 or more.

Figure 7A:
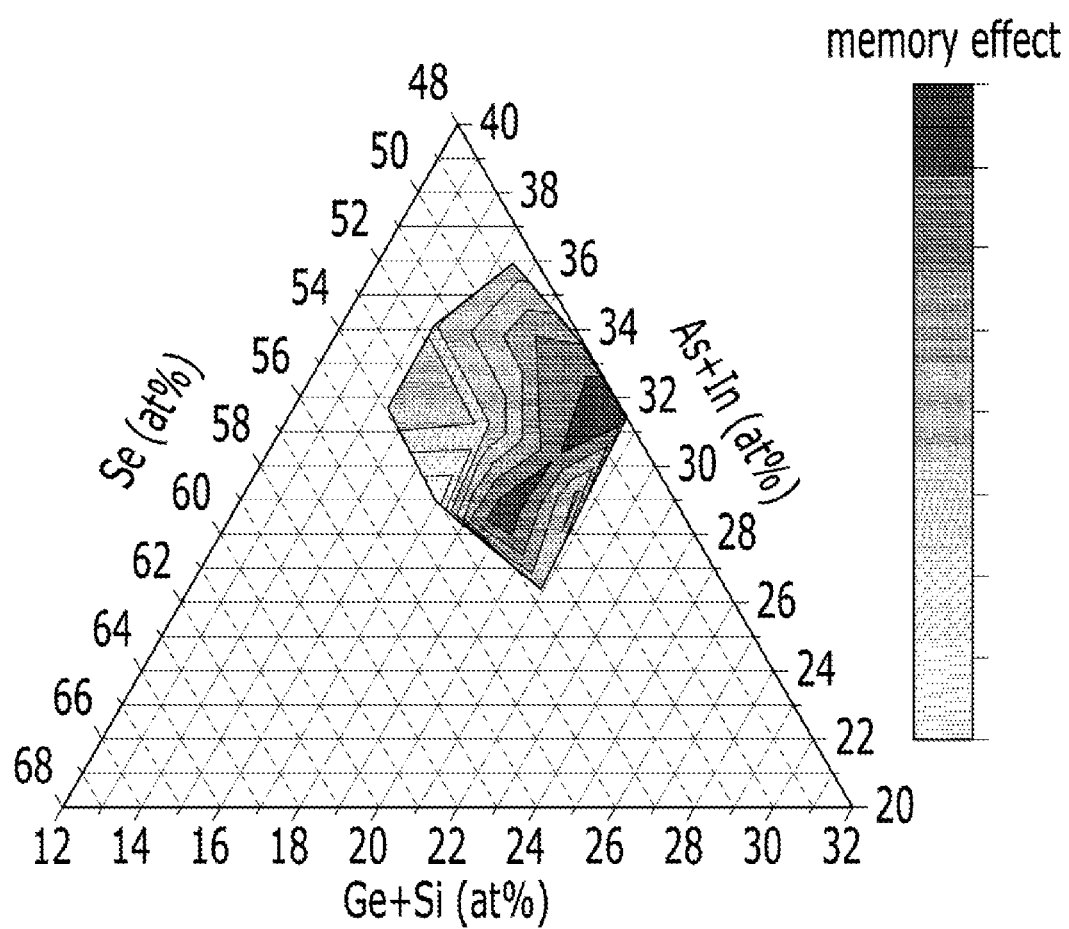
FIGS. 7A to 7C are graphs illustrating operational characteristics of a memory cell including a chalcogenide material in accordance with an embodiment.
Figure 7B:
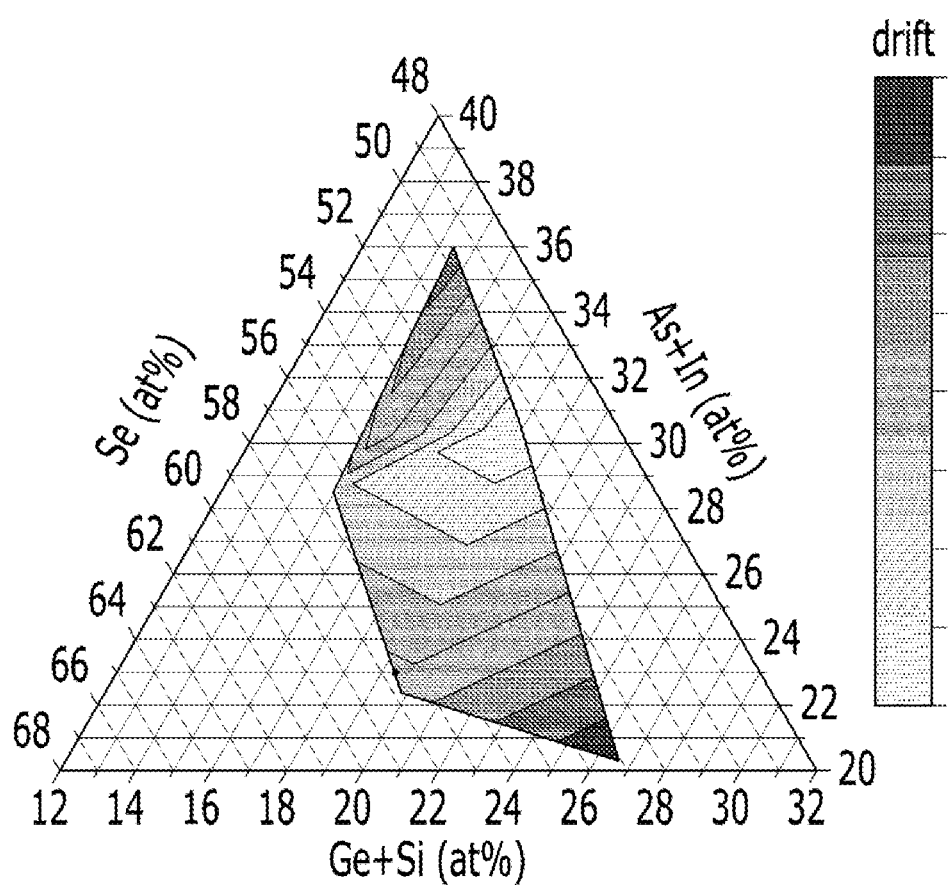
Figure 7C:
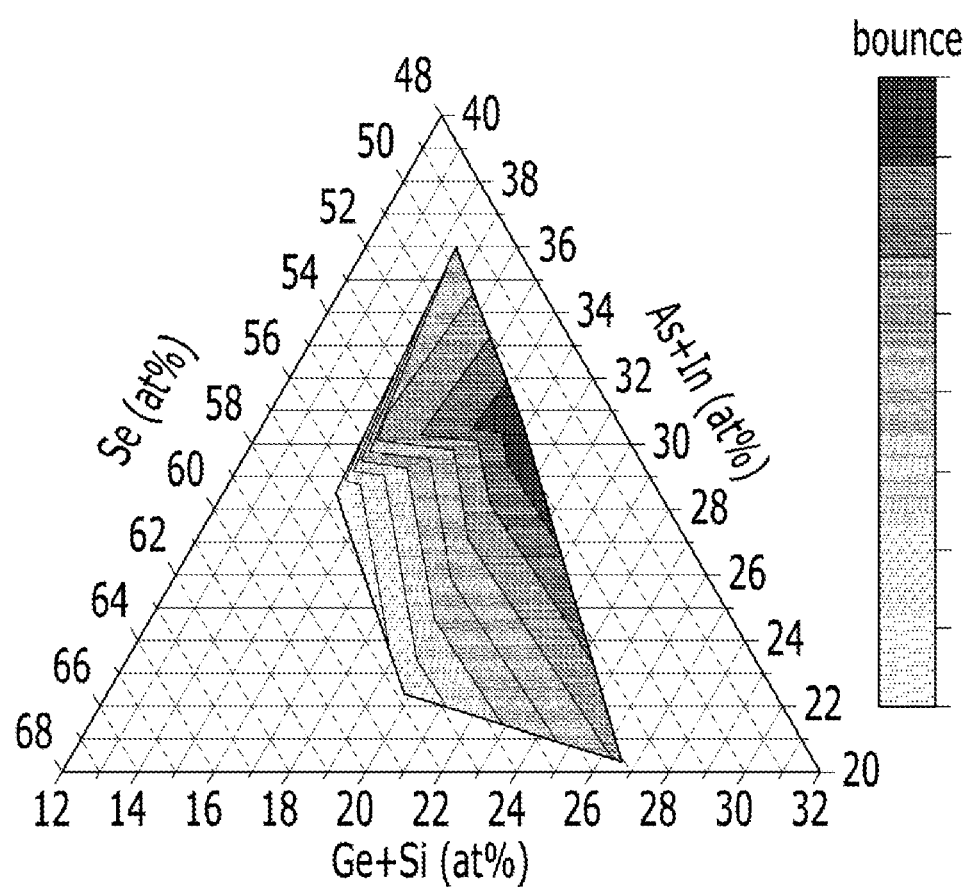

FIGS. 7A to 7C are graphs illustrating operational characteristics of a memory cell including a chalcogenide material in accordance with an embodiment. Each of FIGS. 7A to 7C represents the characteristics of the memory cell depending on a content of selenium (Se), contents of arsenic (As) and indium (In), and contents of germanium (Ge) and silicon (Si) in the chalcogenide material.

FIG. 7A shows a change in a memory effect according to the composition of the chalcogenide material. The memory cell may be programmed into a set state or a reset state by performing a set operation or a reset operation, respectively. In addition, data stored in the memory cell may be sensed using a difference in threshold voltages of the memory cell in the set state and the reset state. Accordingly, as the difference in the threshold voltages increases, a sensing window may be widened, and thus a read margin may be secured. Since the memory effect is related to the sensing window, the composition of the chalcogenide material may be determined in consideration of the memory effect. A group 14 (group IVA) element included in the chalcogenide material may contribute to the memory effect. Accordingly, by adjusting the sum of the contents of germanium (Ge) and silicon (Si) to the range of 18 at % to 21 at %, it is possible to increase the memory effect.

FIG. 7B shows a change in drift depending on the composition of the chalcogenide material. The drift represents a threshold voltage variation of a memory cell having a set state or a reset state. The drift is related to structural relaxation of the chalcogenide material. When the chalcogenide material is stable to the structural relaxation, the drift may be small.

The composition of the chalcogenide material corresponding to stoichiometry may be $(GeSe_2)_x(SiSe_2)_y(In_2Se_3)_z(As2Se3)_{1-x-y-z}$, where "x", "y," and "z" are greater than 0 and smaller than 1, and the chalcogenide material whose mean coordination number MCN is from 2.4 to 2.67 may be stable to the structural relaxation. Since selenium (Se) having an appropriate content is included in the chalcogenide material, an energetic change may be small even though a bond corresponding to a short range order is annihilated. When selenium (Se) is deficient (Se-deficient) or excessive (Se-excess), the drift may increase because the energy change is large after the bond is annihilated. Therefore, by adjusting the content of selenium (Se) to a range of 49 at % to 56 at %, it is possible to decrease the drift.

FIG. 7C shows a change in bouncing depending on the composition of the chalcogenide material. The bouncing may be a type of random telegraph noise, and represent a threshold voltage distribution of memory cells. By decreasing a trap positioned on a near band edge (NBE) in a Se-deficient region, for example, a defect level due to an excessive element except for a group 14 (group IVA) element, it is possible to improve the bouncing. In addition, by reducing the mean coordination number MCN or increasing the content of selenium (Se), it is possible to improve the bouncing.

As described above, in order to use the chalcogenide material as a variable resistance layer of a memory cell, the composition of the chalcogenide material may be determined in consideration of a manufacturing process of the memory cell, reliability of the memory cell, and the like. In addition to a leakage current, an energy band gap, and a mean coordination number, roughness, drift, bouncing, and the like may be complexly considered, and a trade-off relationship between these characteristics may be considered. For example, in order to improve the bouncing, the mean coordination number MCN may be reduced or the content of selenium (Se) may be reduced, but in order to increase thermal stability, the mean coordination number MCN may be increased, which makes it possible to increase bond strength and raise a glass transition temperature.

Accordingly, the composition of the chalcogenide material usable as a switching layer of a memory cell may be determined in consideration of the above characteristics. For example, the chalcogenide material may include germanium (Ge), selenium (Se), arsenic (As), silicon (Si), and indium (In), the content of selenium (Se) may be 49 to 56 at %, the content of indium (In) may be 1.1 at % or less, and the sum of contents of germanium (Ge) and silicon (Si) may be 18 to 21 at %. The chalcogenide material may have a mean coordination number MCN of 2.60 to 2.68 or 2.64 to 2.68.

While the present disclosure has been illustrated and described with respect to specific embodiment, the disclosed embodiment is provided for the description, and not intended to be restrictive. Further, it is noted that the present disclosure may be achieved in various ways through substitution, change, and modification that fall within the scope of the following claims, as those skilled in the art will recognize in light of the present disclosure.

What is claimed is:

1. A chalcogenide material comprising germanium (Ge), selenium (Se), arsenic (As), silicon (Si), and indium (In),
   wherein, in the chalcogenide material, a content of selenium (Se) is 49 at % to 56 at %, a content of indium (In) is 1.1 at % or less, and a sum of contents of germanium (Ge) and silicon (Si) is 18 at % to 21 at %, and
   wherein a mean coordination number of the chalcogenide material is 2.60 to 2.68.

2. The chalcogenide material of claim 1, wherein a mean coordination number of the chalcogenide material is 2.64 to 2.68.

3. The chalcogenide material of claim 1, wherein the content of indium (In) is 0.45 at % to 1.1 at %.

4. A semiconductor device comprising:
   a first electrode;
   a second electrode; and
   a first variable resistance layer positioned between the first electrode and the second electrode, and including a chalcogenide material,
   wherein the chalcogenide material includes germanium (Ge), selenium (Se), arsenic (As), silicon (Si), and indium (In), and has a mean coordination number of 2.60 to 2.68.

5. The semiconductor device of claim 4, wherein a content of selenium (Se) in the chalcogenide material is 49 at % to 56 at %.

6. The semiconductor device of claim 4, wherein a content of indium (In) in the chalcogenide material is 1.1 at % or less.

7. The semiconductor device of claim 4, wherein a content of indium (In) in the chalcogenide material is 3.38 at % or less.

8. The semiconductor device of claim 7, wherein the mean coordination number of the chalcogenide material is 2.64 to 2.68.

9. The semiconductor device of claim 4, wherein a sum of contents of germanium (Ge) and silicon (Si) in the chalcogenide material is 18 at % to 21 at %.

10. The semiconductor device of claim 4, wherein the first variable resistance layer maintains an amorphous state during an operation of the semiconductor device.

11. The semiconductor device of claim 4, further comprising:
    a third electrode; and
    a second variable resistance layer positioned between the second electrode and the third electrode.

12. The semiconductor device of claim 11, wherein the first variable resistance layer is a switching layer, and the second variable resistance layer is a memory layer.

13. The semiconductor device of claim 4, further comprising:
    a word line; and
    a bit line intersecting the word line,
    wherein a memory cell is connected between the word line and the bit line, and includes the first electrode, the second electrode, and the first variable resistance layer.

14. A chalcogenide material comprising germanium (Ge), selenium (Se), arsenic (As), silicon (Si), and indium (In),
    wherein a mean coordination number of the chalcogenide material is 2.60 to 2.68.

15. The chalcogenide material of claim 14, wherein a content of selenium (Se) in the chalcogenide material is 49 at % to 56 at %.

16. The chalcogenide material of claim 14, wherein a content of indium (In) in the chalcogenide material is 1.1 at % or less.

17. The chalcogenide material of claim 14, wherein a content of indium (In) in the chalcogenide material is 3.38 at % or less.

18. The chalcogenide material of claim 17, wherein the mean coordination number of the chalcogenide material is 2.64 to 2.68.

19. The chalcogenide material of claim 14, wherein a sum of contents of germanium (Ge) and silicon (Si) in the chalcogenide material is 18 at % to 21 at %.

* * * * *